United States Patent
Mihaylov

(10) Patent No.: US 7,595,471 B1
(45) Date of Patent: Sep. 29, 2009

(54) AUTO FOCUSING OF A WORKPIECE USING AN ARRAY DETECTOR EACH WITH A DETECTOR IDENTIFICATION

(75) Inventor: Mihail Mihaylov, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/242,839

(22) Filed: Sep. 30, 2008

(51) Int. Cl.
G02B 7/04 (2006.01)
(52) U.S. Cl. .................. 250/201.2; 250/548
(58) Field of Classification Search ............. 250/201.2, 250/201.7, 201.8, 548, 559.3; 356/237.1–237.6, 356/399–402; 700/97–103
See application file for complete search history.

(56) References Cited

U.S. PATENT DOCUMENTS

| | | | |
|---|---|---|---|
| 5,666,202 A * | 9/1997 | Kyrazis .................. 356/614 |
| 6,778,273 B2 | 8/2004 | Norton et al. |
| 6,785,638 B2 | 8/2004 | Niu et al. |
| 6,891,626 B2 | 5/2005 | Niu et al. |
| 6,943,900 B2 | 9/2005 | Jakatdar et al. |
| 7,280,229 B2 | 10/2007 | Li et al. |

| | | |
|---|---|---|
| 2005/0192914 A1 | 9/2005 | Drege et al. |
| 2005/0209816 A1 | 9/2005 | Vuong et al. |

OTHER PUBLICATIONS

U.S. Appl. No. 12/050,053, filed Mar. 17, 2008 for Tian et al.
U.S. Appl. No. 12/050,919, filed Mar. 18, 2008 for Tian et al.
U.S. Appl. No. 12/057,316, filed Mar. 27, 2008 for Tian et al.
U.S. Appl. No. 12/057,332, filed Mar. 27, 2008 for Tian et al.
U.S. Appl. No. 12/057,346, filed Mar. 27, 2008 for Tian et al.
U.S. Appl. No. 12/059,610, filed Mar. 31, 2008 for Meng et al.
U.S. Appl. No. 12/141,754, filed Jun. 18, 2008 for Tian et al.
U.S. Appl. No. 12/141,867, filed Jun. 18, 2008 for Tian et al.
U.S. Appl. No. 12/141,892, filed Jun. 18, 2008 for Tian et al.

* cited by examiner

*Primary Examiner*—Que T Le
(74) *Attorney, Agent, or Firm*—Manuel B. Madriaga

(57) ABSTRACT

Provided is a method and system for auto focusing a workpiece in the Z-axis using a position sensitive focus detector. A focus detection beam is measured using a focus detector, the focus detector having an array of sensors, each sensor of the array of sensors having a sensor identification, the focus detector measuring the focus detection beam projected on a plurality of sensors in the array of sensors, generating a corresponding focus signal for each sensor in the array of sensors. The plurality of focus signals and associated sensor data is used to generate a best focus instruction which is used to move the workpiece to the best focus position on the Z-axis.

18 Claims, 7 Drawing Sheets

AUTO FOCUSING OF A WORKPIECE USING AN ARRAY DETECTOR EACH WITH A DETECTOR IDENTIFICATION

BACKGROUND

1. Field

The present application generally relates to the design of an optical metrology system to measure a structure formed on a workpiece, and, more particularly, to a method and an apparatus for auto focusing the workpiece in the optical metrology system with an array detector.

2. Related Art

Optical metrology involves directing an incident beam at a structure on a workpiece, measuring the resulting diffraction signal, and analyzing the measured diffraction signal to determine various characteristics of the structure. The workpiece can be a wafer, a substrate, a photomask or a magnetic medium. In manufacturing of the workpieces, periodic gratings are typically used for quality assurance. For example, one typical use of periodic gratings includes fabricating a periodic grating in proximity to the operating structure of a semiconductor chip. The periodic grating is then illuminated with electromagnetic radiation. The electromagnetic radiation scattered by the periodic grating are collected as a diffraction signal. The diffraction signal is then analyzed to determine whether the periodic grating and, by extension, whether the operating structure of the semiconductor chip has been fabricated according to specifications.

In one conventional system, the diffraction signal collected from illuminating the periodic grating (the measured diffraction signal) is compared to a library of simulated diffraction signals. Each simulated diffraction signal in the library is associated with a hypothetical profile. When a match is made between the measured diffraction signal and one of the simulated diffraction signals in the library, the hypothetical profile associated with the simulated diffraction signal is presumed to represent the actual profile of the periodic grating. The hypothetical profiles, which are used to generate the simulated diffraction signals, are generated based on a profile model that characterizes the structure to be examined. Thus, in order to accurately determine the profile of the structure using optical metrology, a profile model that accurately characterizes the structure should be used.

With increased requirement for throughput, decreasing size of the test structures, smaller spot sizes, and lower cost of ownership, there is greater need to optimize the design of optical metrology systems to meet several design goals. Characteristics of the optical metrology system including throughput, range of measurement capabilities, accuracy and repeatability of diffraction signal measurements are essential to meeting the increased requirement for smaller spot size and lower cost of ownership of the optical metrology system. Accurate and rapid auto focusing of the workpiece contributes to meeting the above objectives of the optical metrology system.

SUMMARY

Provided is a method and system for auto focusing a workpiece in the Z-axis using a position sensitive focus detector. A focus detection beam is measured using a focus detector, the focus detector having an array of sensors, each sensor of the array of sensors having a sensor identification, the focus detector measuring the focus detection beam projected on a plurality of sensors in the array of sensors, generating a corresponding focus signal for each sensor in the array of sensors. The plurality of focus signals and associated sensor data is used to generate a best focus instruction which is used to move the workpiece to the best focus position on the Z-axis.

BRIEF DESCRIPTION OF DRAWINGS

FIG. 4A depicts an architectural diagram illustrating an auto focusing subsystem of an optical metrology tool whereas

DETAILED DESCRIPTION

In order to facilitate the description of the present invention, a semiconductor wafer may be utilized to illustrate an application of the concept. The systems and processes equally apply to other workpieces that have repeating structures. The workpiece may be a wafer, a substrate, disk, or the like. Furthermore, in this application, the term structure when it is not qualified refers to a patterned structure.

Figure 1:
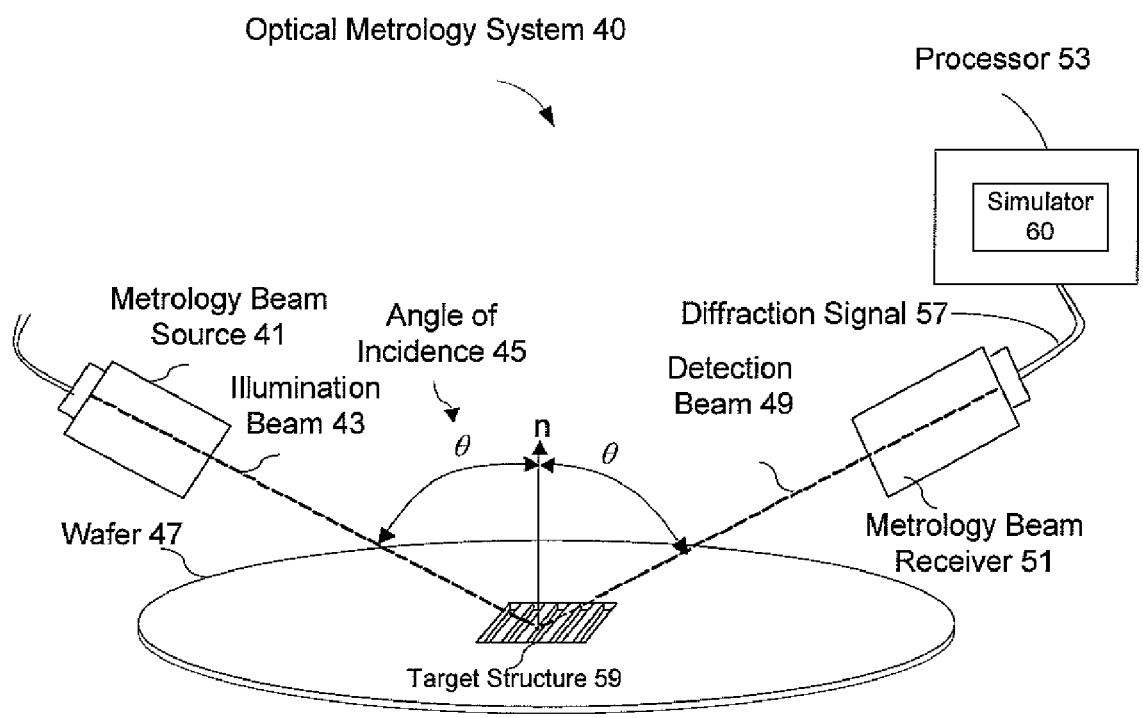
FIG. 1 is an architectural diagram illustrating an exemplary embodiment where an optical metrology system can be utilized to determine the profiles of structures formed on a semiconductor wafer.

FIG. 1 is an architectural diagram illustrating an exemplary embodiment where optical metrology can be utilized to determine the profiles or shapes of structures fabricated on a semiconductor wafer. The optical metrology system 40 includes a metrology beam source 41 projecting a metrology illumination beam 43 at the target structure 59 of a wafer 47. The metrology beam 43 is projected at an incidence angle θ (label 45 in FIG. 1) towards the target structure 59. The diffracted detection beam 49 is measured by a metrology beam receiver 51. A measured diffraction signal 57 is transmitted to a processor 53. The processor 53 compares the measured diffraction signal 57 against a simulator 60 of simulated diffraction signals and associated hypothetical profiles representing varying combinations of critical dimensions of the target structure and resolution. The simulator can be either a library that consists of a machine learning system, pre-generated data base and the like (e.g., this is a library system), or on demand diffraction signal generator that solves the Maxwell equation for a giving profile (e.g., this is a regression system). In one exemplary embodiment, the diffraction signal generated by the simulator 60 instance best matching the measured diffraction signal 47 is selected. The hypothetical profile and associated critical dimensions of the selected simulator 60 instance are assumed to correspond to the actual cross-sectional shape and critical dimensions of the features of the target structure 59. The optical metrology system 40 may utilize a reflectometer, an ellipsometer, or other optical metrology device to measure the diffraction beam or signal. An optical metrology system is described in U.S. Pat. No. 6,913,900, entitled "GENERATION OF A LIBRARY OF PERIODIC GRATING DIFFRACTION SIGNAL", issued on Sep. 13, 2005, which is incorporated herein by reference in its entirety.

Simulated diffraction signals can be generated by applying Maxwell's equations and using a numerical analysis technique to solve Maxwell's equations. It should be noted that various numerical analysis techniques, including variations of rigorous coupled-wave analysis (RCWA) can be used. For a more detail description of RCWA, see U.S. Pat. No. 6,891,626, titled CACHING OF INTRA-LAYER CALCULATIONS FOR RAPID RIGOROUS COUPLED-WAVE ANALYSES, filed on Jan. 25, 2001, issued May 10, 2005, which is incorporated herein by reference in its entirety.

Simulated diffraction signals can also be generated using a machine learning system (MLS). Prior to generating the simulated diffraction signals, the MLS is trained using known input and output data. In one exemplary embodiment, simulated diffraction signals can be generated using an MLS employing a machine learning algorithm, such as back-propagation, radial basis function, support vector, kernel regression, and the like. For a more detailed description of machine learning systems and algorithms, see U.S. patent application Ser. No. 10/608,300, entitled "OPTICAL METROLOGY OF STRUCTURES FORMED ON SEMICONDUCTOR WAFERS USING MACHINE LEARNING SYSTEMS", filed on Jun. 27, 2003, which is incorporated herein by reference in its entirety.

Figure 2:
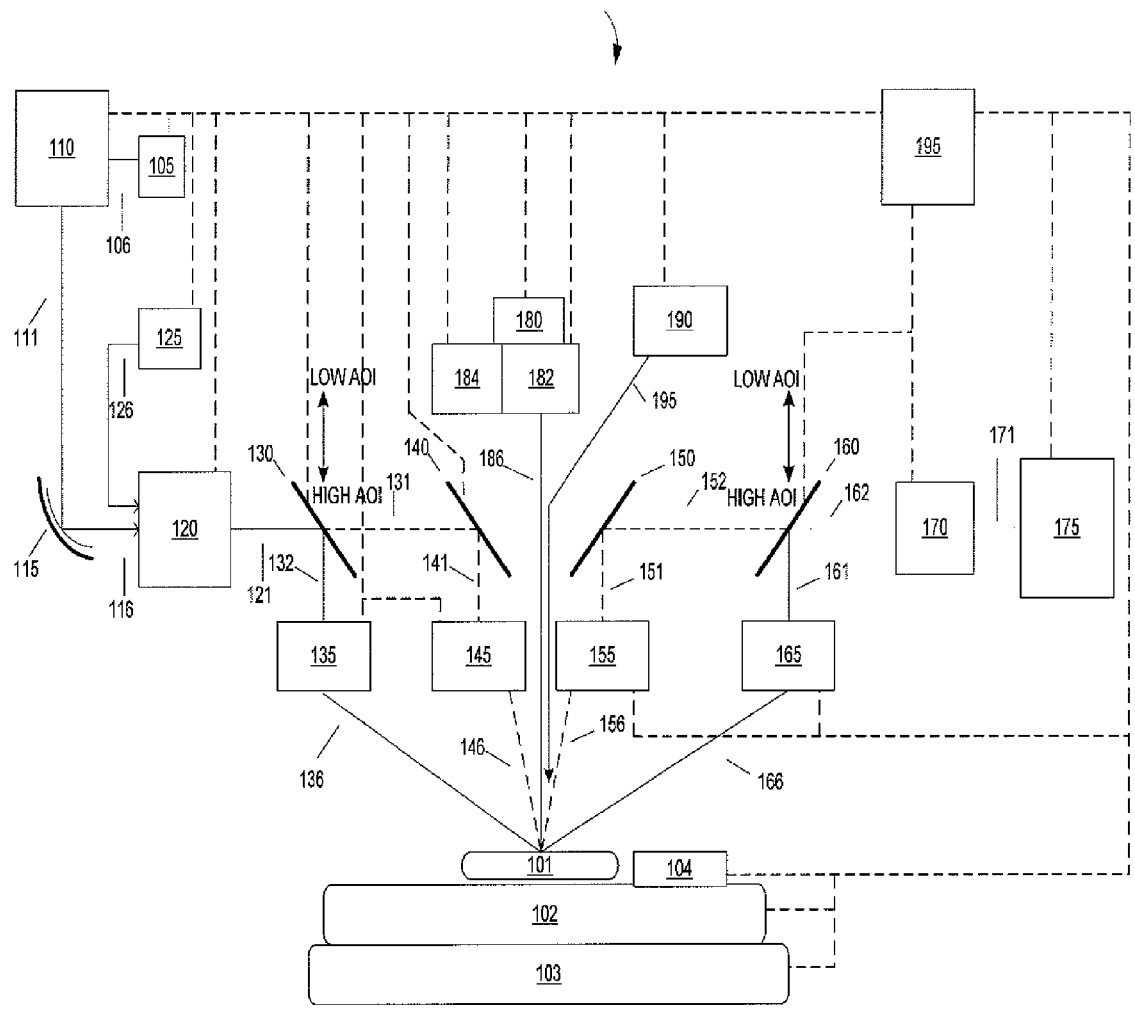
FIG. 2 depicts an exemplary optical metrology system in accordance with embodiments of the invention.

FIG. 2 shows an exemplary block diagram of an optical metrology system in accordance with embodiments of the invention. In the illustrated embodiment, an optical metrology system 100 can comprise a lamp subsystem 105, and at least two optical outputs 106 from the lamp subsystem can be transmitted to an illuminator subsystem 110. At least two optical outputs 111 from the illuminator subsystem 110 can be transmitted to a selector subsystem 115. The selector subsystem 115 can send at least two signals 116 to a beam generator subsystem 120. In addition, a reference subsystem 125 can be used to provide at least two reference outputs 126 to the beam generator subsystem 120. The wafer 101 is positioned using an X-Y-Z-theta stage 102 where the wafer 101 is adjacent to a wafer alignment sensor 104, supported by a platform base 103.

The optical metrology system 100 can comprise a first selectable reflection subsystem 130 that can be used to direct at least two outputs 121 from the beam generator subsystem 120 on a first path 131 when operating in a first mode "LOW AOI" (AOI, Angle of Incidence) or on a second path 132 when operating in a second mode "HIGH AOI". When the first selectable reflection subsystem 130 is operating in the first mode "LOW AOI", at least two of the outputs 121 from the beam generator subsystem 120 can be directed to a first reflection subsystem 140 as outputs 131, and at least two outputs 141 from the first reflection subsystem can be directed to a high angle focusing subsystem 145, When the first selectable reflection subsystem 130 is operating in the second mode "HIGH AOI", at least two of the outputs 121 from the beam generator subsystem 120 can be directed to a low angle focusing subsystem 135 as outputs 132. Alternatively, other modes in addition to "LOW AOI" and "HIGH AOI" may be used and other configurations may be used.

When the metrology system 100 is operating in the first mode "LOW AOI", at least two of the outputs 146 from the high angle focusing subsystem 145 can be directed to the wafer 101. For example, a high angle of incidence can be used. When the metrology system 100 is operating in the second mode "HIGH AOI", at least two of the outputs 136 from the low angle focusing subsystem 135 can be directed to the wafer 101. For example, a low angle of incidence can be used. Alternatively, other modes may be used and other configurations may be used.

The optical metrology system 100 can comprise a high angle collection subsystem 155, a low angle collection subsystem 165, a second reflection subsystem 150, and a second selectable reflection subsystem 160.

When the metrology system 100 is operating in the first mode "LOW AOI", at least two of the outputs 156 from the wafer 101 can be directed to the high angle collection subsystem 155. For example, a high angle of incidence can be used. In addition, the high angle collection subsystem 155 can process the outputs 156 obtained from the wafer 101 and high angle collection subsystem 155 can provide outputs 151 to the second reflection subsystem 150, and the second reflection subsystem 150 can provide outputs 152 to the second selectable reflection subsystem 160. When the second selectable reflection subsystem 160 is operating in the first mode "LOW AOI" the outputs 152 from the second reflection subsystem 150 can be directed to the analyzer subsystem 170. For example, at least two blocking elements can be moved allowing the outputs 152 from the second reflection subsystem 150 to pass through the second selectable reflection subsystem 160 with a minimum amount of loss.

When the metrology system 100 is operating in the second mode "HIGH AOI", at least two of the outputs 166 from the wafer 101 can be directed to the low angle collection subsystem 165. For example, a low angle of incidence can be used. In addition, the low angle collection subsystem 165 can process the outputs 166 obtained from the wafer 101 and low angle collection subsystem 165 can provide outputs 161 to the second selectable reflection subsystem 160. When the second selectable reflection subsystem 160 is operating in the second mode "HIGH AOI" the outputs 162 from the second selectable reflection subsystem 160 can be directed to the analyzer subsystem 170.

When the metrology system 100 is operating in the first mode "LOW AOI", high incident angle data from the wafer 101 can be analyzed using the analyzer subsystem 170, and when the metrology system 100 is operating in the second mode "HIGH AOI", low incident angle data from the wafer 101 can be analyzed using the analyzer subsystem 170.

Metrology system 100 can include at least two measurement subsystems 175. At least two of the measurement subsystems 175 can include at least two detectors such as spectrometers. For example, the spectrometers can operate from the Deep-Ultra-Violet to the visible regions of the spectrum.

The metrology system 100 can include at least two camera subsystems 180, at least two illumination and imaging subsystems 182 coupled to at least two of the camera subsystems 180. In addition, the metrology system 100 can also include at least two illuminator subsystems 184 that can be coupled to at least two of the imaging subsystems 182.

In some embodiments, the metrology system 100 can include at least two auto-focusing subsystems 190. Alternatively, other focusing techniques may be used.

At least two of the controllers (not shown) in at least two of the subsystems (105, 110, 115, 120, 125, 130, 135, 140, 145, 150, 155, 160, 165, 170, 175, 180, 182, 190, and 195) can be used when performing measurements of the structures. A controller can receive real-signal data to update subsystem, processing element, process, recipe, profile, image, pattern, and/or model data. At least two of the subsystems (105, 110, 115, 120, 125, 130, 135, 140, 145, 150, 155, 160, 165, 170, 175, 180, 182, and 190) can exchange data using at least two Semiconductor Equipment Communications Standard (SECS) messages, can read and/or remove information, can feed forward, and/or can feedback the information, and/or can send information as a SECS message.

Those skilled in the art will recognize that at least two of the subsystems (105, 110, 115, 120, 125, 130, 135, 140, 145, 150, 155, 160, 165, 170, 175, 180, 182, 190, and 195) can include computers and memory components (not shown) as required. For example, the memory components (not shown) can be used for storing information and instructions to be executed by computers (not shown) and may be used for storing temporary variables or other intermediate information during the execution of instructions by the various computers/processors in the metrology system 100. At least two of the subsystems (105, 110, 115, 120, 125, 130, 135, 140, 145, 150, 155, 160, 165, 170, 175, 180, 185, and 190) can include the means for reading data and/or instructions from a computer readable medium and can comprise the means for writing data and/or instructions to a computer readable medium. The metrology system 100 can perform a portion of or all of the processing steps of the invention in response to the computers/processors in the processing system executing at least two sequences of at least two instructions contained in a memory and/or received in a message. Such instructions may be received from another computer, a computer readable medium, or a network connection. In addition, at least two of the subsystems (105, 110, 115, 120, 125, 130, 135, 140, 145, 150, 155, 160, 165, 170, 175, 180, 182, and 190) can comprise control applications, Graphical User Interface (GUI) components, and/or database components.

It should be noted that the beam when the metrology system 100 is operating in the first mode "LOW AOI" with a high incident angle data from the wafer 101 all the way to the measurement subsystems 175, (output 166, 161, 162, and 171) and when the metrology system 100 is operating in the second mode "HIGH AOI" with a low incident angle data from the wafer 101 all the way to the measurement subsystems 175, (output 156, 151, 152, 162, and 171) is referred to as diffraction signal(s).

Figure 3A:
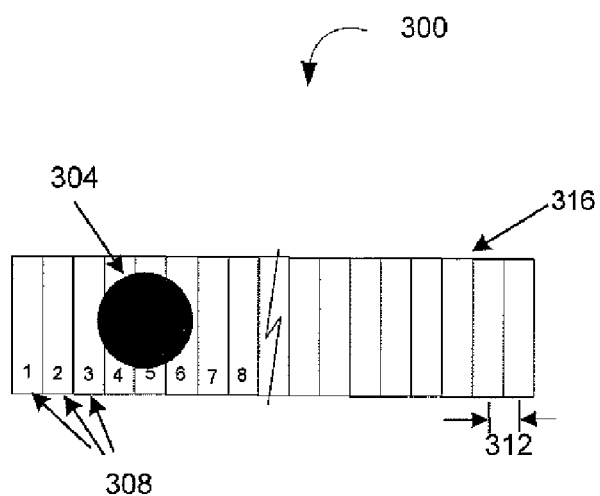
FIG. 3A depicts an exemplary focus detection sensor array where the sensors include a pitch and identification.

FIG. 3A depicts top-view of an exemplary focus detector 300 with a focus detection sensor array 316 where the sensors include a pitch 312 and identification, labeled numerically as individual sensors 308. The focus detection sensor array 316 may comprise 256, 512, 1024 or higher number of sensors 308 arranged linearly in a contiguous manner. The pitch 312 for sensors 308 represents the distance between the centers of a sensor to the center of a next contiguous sensor. A focus detection beam 304 is directed to the focus detection sensor array 316 where the focus detection beam 304 strikes sensors 308 identified as sensor 3, sensor 4, sensor 5, and sensor 6. Sensor 5 has the most exposure to the focus detection beam 304 and would register the highest value of the reading of the focus detection beam 304 by the focus detector 300. Sensors 1, 2, 7, and 8 and those not identified would also register a value of the reading due to ambient light or background electromagnetic noise.

Figure 3B:
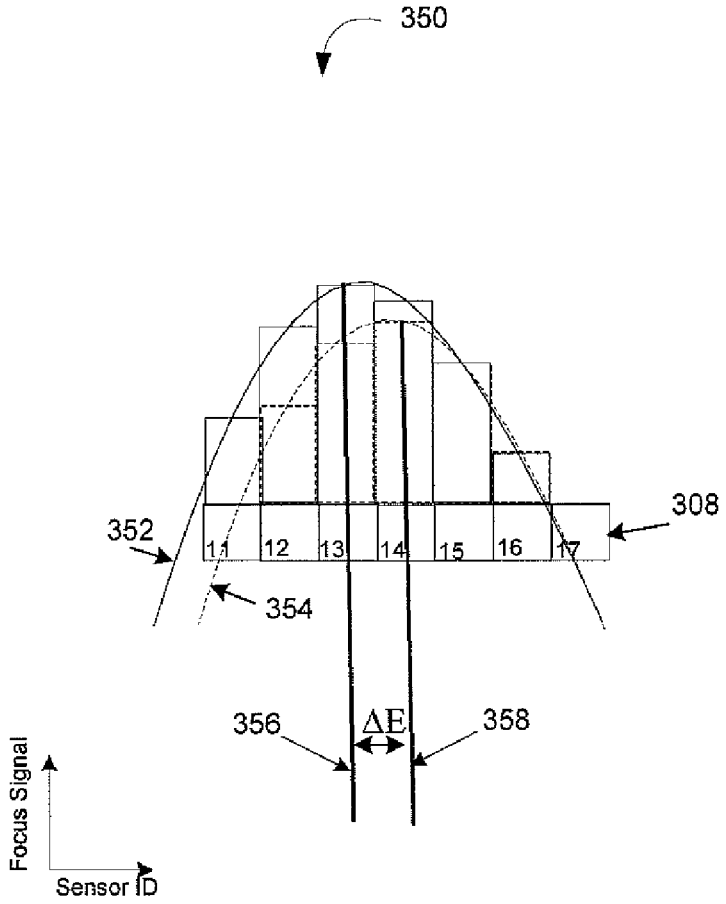
FIG. 3B depicts an exemplary graph of the detector signal measured for the sensors identified and the distance of the calibrated best focus signals for the workpiece and highest detector signal of the current Z-axis position of the workpiece.

FIG. 3B depicts an exemplary graph 350 of two sets of detector signals measured by a focus detector for the identified sensors. The first graph 352 from the left depicts a graph of measured focus signals for a calibration run of a focus detector using a first workpiece. The highest value of the focus signal graph 352 corresponds to sensor 13 and is highlighted by line 356 and represents the best focus location in Z-axis for the type of workpiece and structures on the workpiece. Typically, the best focus corresponds to highest value of the focus signal and the best focus location is the position of the workpiece on the Z-axis that corresponds to the best focus. Assume that one looks at a family of graphs 352, the best focus is the one having the highest peak focus signal and the best focus location is the position of the workpiece on the Z-axis corresponding to the highest peak.

Still referring to FIG. 3b, using a second workpiece similar to the first workpiece in a regular measurement run, measured focus signals are collected for all the sensors 308 and values for the same sensors that are depicted in the first graph 352 are overlaid and shown as second graph 354. The highest value of the focus signal for graph 354 corresponds to sensor 14 and is highlighted by line 358. The distance between the calibrated highest value 356 for the calibration run and regular measurement run is the incremental error, $\Delta E$, in the current position of the second workpiece compared to the calibrated best focus position in the Z-axis. As will shown later below, $\Delta E$ can be used by a processor (not shown) together with the pitch of the sensors, equipment characteristics of the motion control subsystem (not shown) to generate best focus instruction.

Figure 4A:
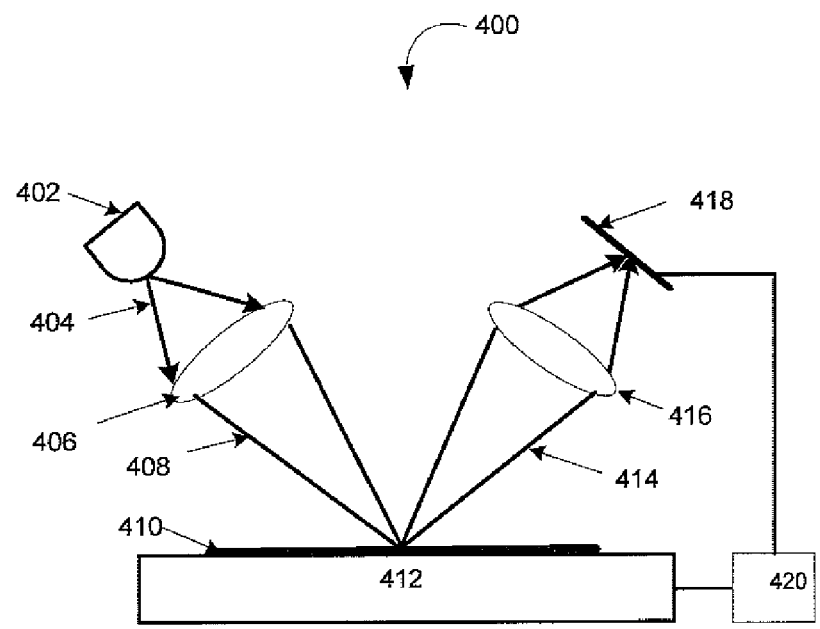

FIG. 4A depicts an architectural diagram illustrating an auto focusing subsystem of an optical metrology tool. Referring to FIG. 4A, the auto focusing subsystem of an optical metrology tool 400 comprises a focus illumination source 402. The focus illumination source 402 generates a focus illumination beam 404 directed to optical focusing component 406 generating focus projection beam 408 onto a workpiece 410. The focus illumination source 402 may be a monochromatic beam generator such as a laser beam source or a light emitting diode (LED) or the like. The focus illumination beam 404 may comprise mirrors and/or lenses. As mentioned above, the workpiece 410 may be a wafer, a photomask, substrate, or the like. The workpiece 410 is coupled to a motion control subsystem 412 that may be an X-Y-Z theta stage. A focus detection beam 414 diffracts off workpiece 410 onto an optical collecting component 416, which in turn projects the beam onto focus detector 418. Optical collecting component 416 may comprise mirrors and/or lenses. Focus detector 418 is an array detector that may have 256, 512, or more sensors or where the pitch of the array of sensors is 12.5 nanometers or smaller. The focus detector 418 may have a speed that is appropriate for the range of intended applications; the focus detector 418 may operate at 2 megahertz or higher. The measured focus signal from the focus detector 418 is transmitted to processor 420 where the best focus instruction for workpiece 410 is determined and transmitted to motion control subsystem 412. As mentioned above, the processor 420 takes into account the sensor position of the calibration highest reading of the focus signal compared to the highest reading of the focus signal for the workpiece 410. The processor 420 may be a processor associated with the auto focusing subsystem 400, or a processor associated with the motion control subsystem 412, or any processor coupled to the optical metrology system. Motion control subsystem 412 uses the transmitted best focus instruction to move workpiece 410 to the best focus position in the Z-axis.

Figure 4B:
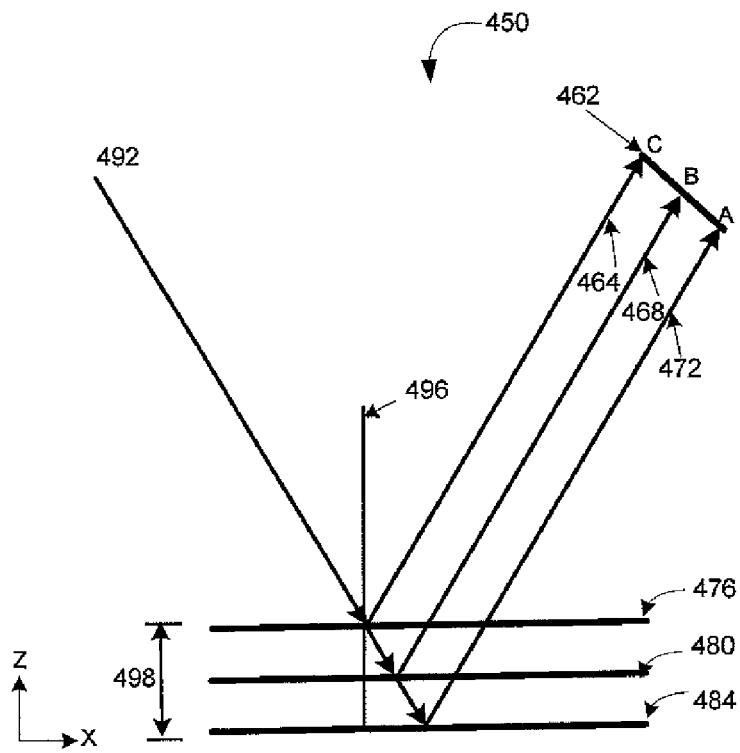
FIG. 4B depicts an architectural diagram illustrating focus illumination beams and focus detection beams with the workpiece at different positions on the Z-axis.

FIG. 4B depicts an architectural diagram illustrating diffraction of an auto focus beam off a workpiece at different positions on the Z-axis. A focus illumination beam 492 is diffracted off a workpiece where the workpiece 484 can be a first position on the Z-axis 496, generating a focus detection beam 472 towards focus detector 462 at point A. The workpiece 484 can be moved to a second position on the Z-axis 496 with a motion control system (not shown) such as the motion control subsystem 412 in FIG. 4A and can be situated on the Z-axis 496 as workpiece 480. The same focus illumination beam 492 at the same angle of incidence is diffracted off workpiece 480 towards a different spot compared to workpiece 484, the illumination beam 492 generating a focus detection beam 468 proceeding to detector 462 at point B. Similarly, workpiece 484 can be moved to a third position on the Z-axis 496 with a motion control system (not shown) such as the motion control subsystem 412 in FIG. 4A and can be situated on the Z-axis 496 as workpiece 476. The same focus illumination beam 492 at the same angle of incidence is diffracted off the workpiece 476 at a different spot compared to workpiece 484, the illumination beam 492 generating a focus detection beam 464 proceeding to detector 462 at point C. Assume the focus detection beam 472 proceeding to focus detector 462 at point A corresponds to the lowest level on the Z-axis 496 where the workpiece can be measured for best focus determination. The workpiece would be moved upwards using a motion control system (not shown) on the Z-axis to find the best focus location. Similarly, assume the focus detection beam 464 proceeding to focus detector 462 at point C corresponds to the highest level on Z-axis 496 where the workpiece can be measured for best focus determination. The workpiece would be moved downwards using a motion control system (not shown) on the Z-axis to find the best focus location.

Referring to FIG. 4B, the vertical distance 498 between workpiece 476 and workpiece 484 represents the measurable adjustment range in the Z-axis 496 to get a workpiece in best focus. For a new semiconductor application, the best focus and best focus location in the Z-axis for a workpiece such as a wafer may be performed prior in a calibration run. The calibration run may include the steps of loading the wafer in the motion control subsystem, positioning the wafer and the focus detector to the highest or lowest level in the Z-axis, making a series of measurements of the focus signal for each sensor in the focus detection sensor array, and correlating the movement of the wafer on the Z-axis to the determined best focus and best focus location. This calibrated best focus position is used for determining the best focus instruction, step 512 of FIG. 5.

Figure 5:
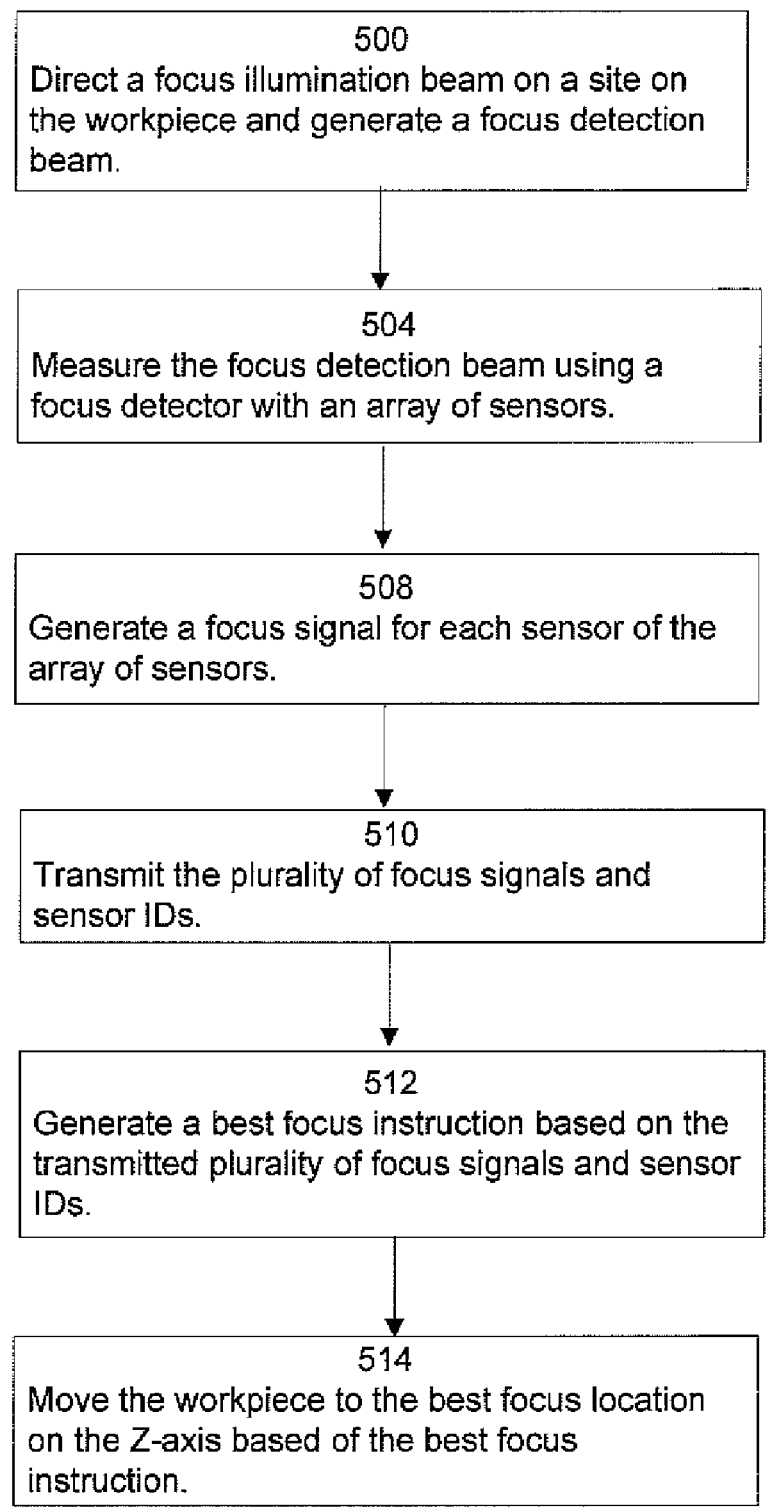
FIG. 5 depicts an exemplary flowchart for auto focusing the workpiece in the Z-axis using an auto focus detector with an array of sensors.

FIG. 5 depicts an exemplary flowchart for auto focusing the workpiece in the Z-axis using an auto focus detector with an array of sensors. In step 500, a focus illumination beam is directed on a site on the workpiece and generates a focus detection beam. In one embodiment, the illumination beam is focused on the structure that will be measured by the optical metrology system. For example, if the optical metrology system that includes the auto focusing subsystem is measuring a patterned resist structure, then the auto focusing subsystem illumination beam is focused on the patterned resist structure. In other embodiments, other sites such as a test area or test structure formed on the scribe lines of the workpiece can also be used for this purpose. In step 504, the focus detection beam is measured using a focus detector with an array of sensors, such as the focus detector depicted in FIG. 3A. The focus detection beam is directed onto one or more sensors of the array of sensors as shown in FIG. 3A. In step 508, a focus signal for each sensor in the array sensors is generated by the focus detector for the focus detection beam directed on the sensor plus any ambient light or other electromagnetic noise present.

In step 510 of FIG. 5, the focus signal for a sensor and the sensor ID are transmitted to a processor for all sensors in the array of sensors. The focus processor may be part of the auto focus subsystem or may be a processor of the optical metrology system or a processor of a process tool in an integrated metrology application. In step 512, a best focus instruction is generated based, among other things, on the transmitted plurality of focus signals and associated sensor IDs, the pitch of the sensor array, and mechanical specifications of the motion control subsystem. The focus signals and sensor IDs can be used to determine the sensor ID that has the highest focus signal value. The sensor ID with the highest focus signal value and the sensor pitch is used to derive a difference between the Z-axis location of the workpiece and the calibrated best focus position of the workpiece. The calibrated best position of the workpiece is determined by using previously measured data with the same type of workpiece and similar structure being measured by the optical metrology system. The difference between the Z-axis location of the workpiece and the calibrated best focus position of the workpiece is illustrated in FIG. 3B as $\Delta E$. Based on the mechanical specifications of the motion control subsystem and the difference between the Z-axis location of the workpiece and the calibrated best focus position, $\Delta E$, a best focus instruction is generated by the processor. The best focus instruction may include the distance the workpiece may have to move up or down to get to the best focus location in the Z-axis. The best focus instruction may be computer instructions or servo commands to move the workpiece in the particular model of the motion control subsystem to the best focus location in the Z-axis. In step 514, the workpiece is moved to the best focus location on the Z-axis based on the best focus instruction.

Figure 6:
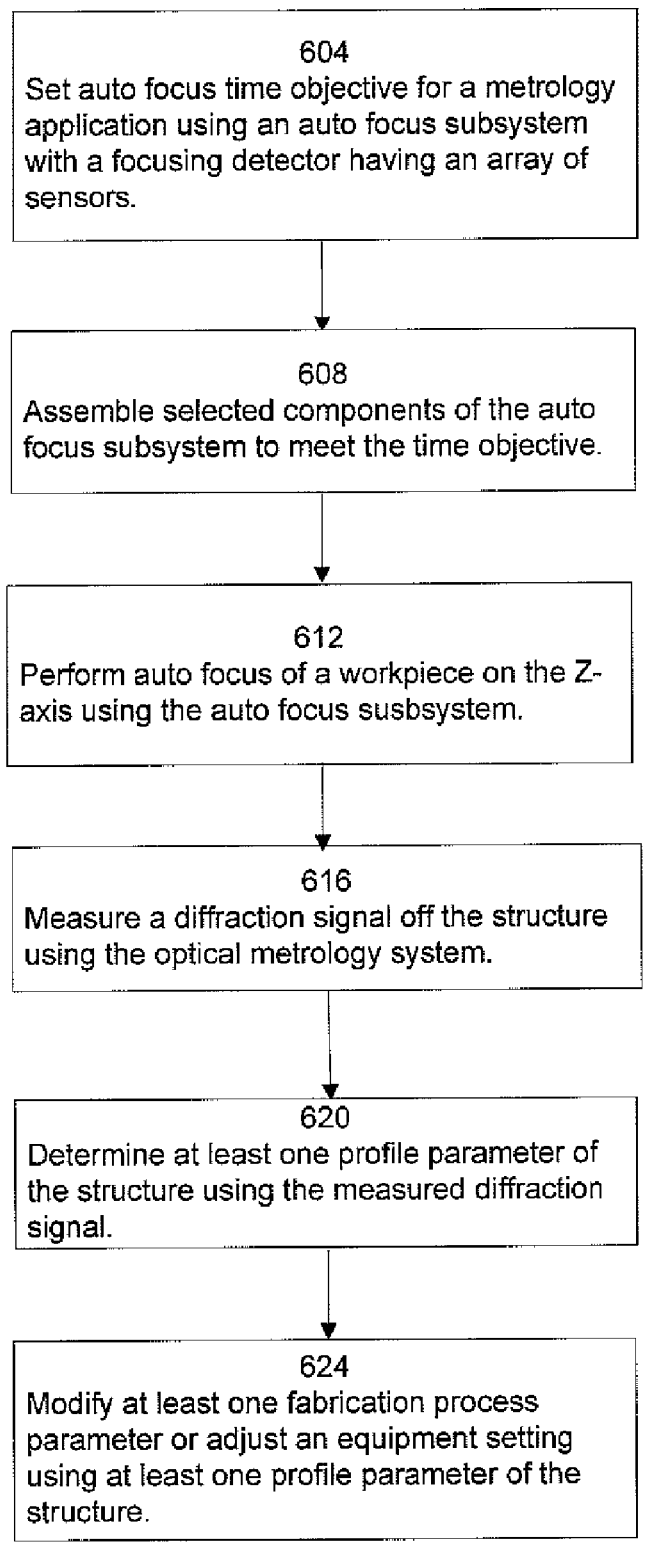
FIG. 6 depicts an exemplary flowchart for designing an auto focus subsystem of an optical metrology system to meet a time objective, and for using the optical metrology system to extract structure profile parameters of a workpiece and control a fabrication process.

FIG. 6 depicts an exemplary flowchart for designing an auto focus subsystem of an optical metrology system to meet a time objective, and for using the optical metrology system to extract structure profile parameters of a workpiece and control a fabrication process. In step 604, an auto focus time objective for a metrology application using an auto focus subsystem with a focus detector having an array of sensors is set. The time objective is coordinated with the other metrology steps needed to complete metrology steps for a structure in a workpiece. For example, in semiconductor wafer processing, assume the optical metrology system is designed to measure 150 or 200 wafers per hour. The time for a single wafer and time for a metrology step, such as auto focusing, are calculated based on the throughput. The calculated time to support the throughput objective of say 200 wafers per hour is the time objective set in this step. In step 608, selected components of the auto focus subsystem to meet the time objective are assembled and integrated into the optical metrology system. As described in relation to FIG. 4A, the components of an auto focus subsystem include a focus illumination source, an optical focusing component, an optical collecting component, a focus detector, and a processor. As mentioned above, a motion control subsystem is used to move the wafer along the Z-axis to the best focus location. The primary components that affect the time objective include the focus detector, the processor, and the motion control subsystem. The focus detector speed is typically measured in hertz or cycles per second. Speed of linear array focus detectors vary from 1, 2, 5 megahertz or higher. There are many processors available presently that can handle the data processing required by the method associated with FIG. 5 for transmitting focus signals and sensor IDs and generating the best focus instruction. Similarly, the motion control subsystem selected needs to have a range of speeds that would enable meeting the set time objective. For more details on steps needed to design an optical metrology system to meet time objectives, refer to U.S. patent application Ser. No. 12/050,053, entitled "METHOD OF DESIGNING AN OPTICAL METROL- OGY SYSTEM OPTIMIZED FOR OPERATING TIME BUDGET" by Tian, et al., filed on Mar. 17, 2008, which is incorporated herein by reference in its entirety.

In step 616 of FIG. 6, one or more diffraction signals off a target structure on the workpiece are measured using the optical metrology system and using the workpiece focused on the Z-axis in step 612. In step 620, at least one profile parameter of the structure is determined using the measured one or more diffraction signals. If the workpiece is a semiconductor wafer, the one profile parameter may be a top critical dimension (CD), a bottom CD, or a sidewall angle. In step 624, at least one fabrication process parameter or equipment setting is modified using the determined at least one profile parameter of the structure. For example, if the workpiece is a wafer, the fabrication process parameter may include a temperature, exposure dose or focus, etchant concentration or gas flow rate. As mentioned above, the optical metrology system may be part of a standalone metrology module or integrated in a fabrication cluster.

Figure 7:
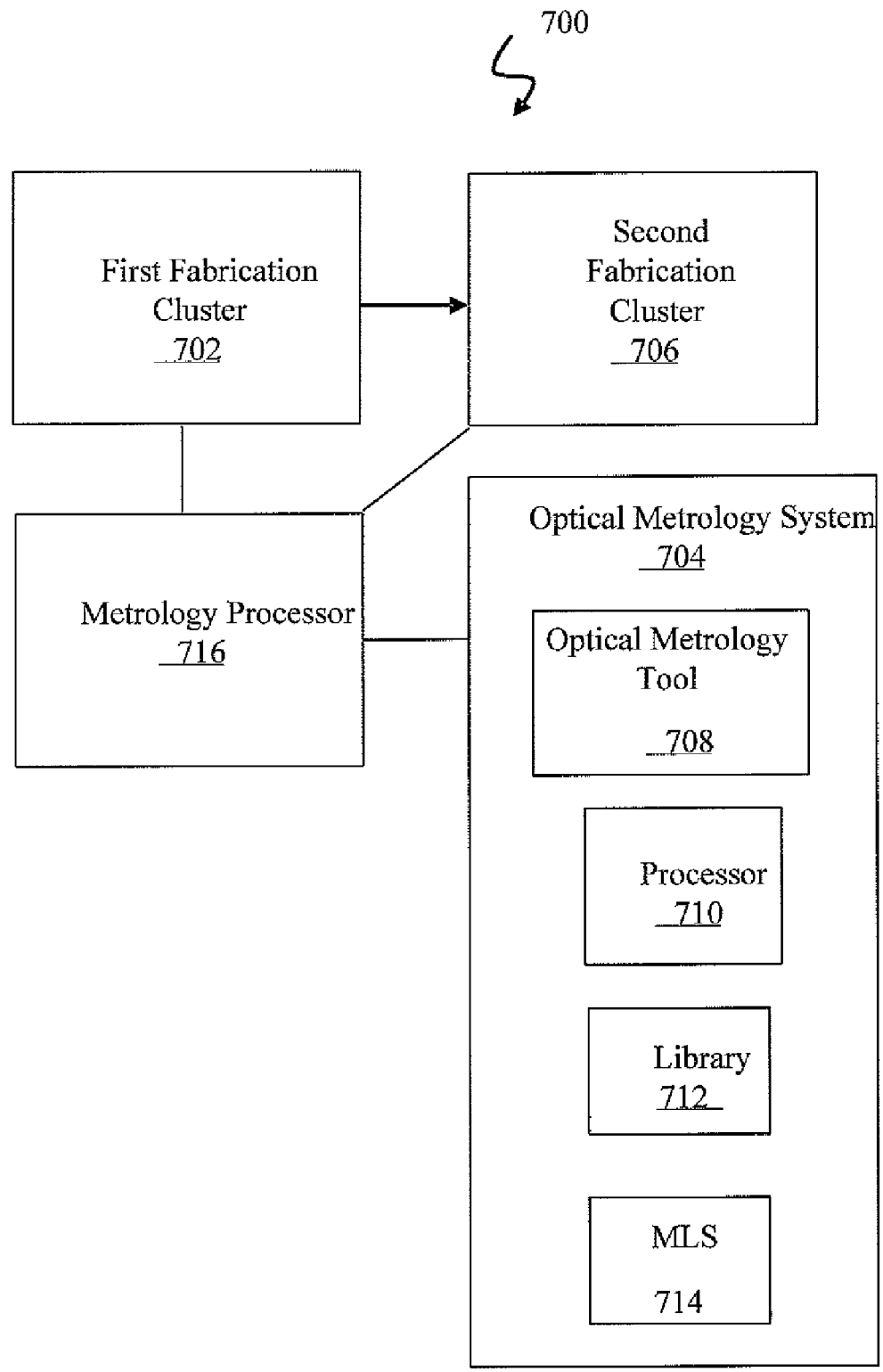
FIG. 7 is an exemplary block diagram of a system for determining and utilizing profile parameters for automated process control and equipment control.

FIG. 7 is an exemplary block diagram of a system for determining and utilizing profile parameters for automated process and equipment control. System 700 includes a first fabrication cluster 702 and optical metrology system 704. System 700 also includes a second fabrication cluster 706. Although the second fabrication cluster 706 is depicted in FIG. 7 as being subsequent to first fabrication cluster 702, it should be recognized that second fabrication cluster 706 can be located prior to first fabrication cluster 702 in system 700 (e.g. and in the manufacturing process flow).

A photolithographic process, such as exposing and/or developing a photoresist layer applied to a wafer, can be performed using first fabrication cluster 702. Optical metrology system 704 is similar to optical metrology system 40 of FIG. 1. In one exemplary embodiment, optical metrology system 704 includes an optical metrology tool 708 and processor 710. Optical metrology tool 708 is configured to measure a diffraction signal off of the structure. Processor 710 is configured to compare the measured diffraction signal measured by the optical metrology tool designed to meet plurality of design goals to a simulated diffraction signal. As mentioned above, the simulated diffraction is determined using a set of profile parameters of the structure and numerical analysis based on the Maxwell equations of electromagnetic diffraction. Other approaches such integral method may be used to generate the simulated diffraction signal. In one exemplary embodiment, optical metrology system 704 can also include a library 712 with a plurality of simulated diffraction signals and a plurality of values of one or more profile parameters associated with the plurality of simulated diffraction signals. As described above, the library can be generated in advance; metrology processor 710 can compare a measured diffraction signal off a structure to the plurality of simulated diffraction signals in the library. When a matching simulated diffraction signal is found, the one or more values of the profile parameters associated with the matching simulated diffraction signal in the library is assumed to be the one or more values of the profile parameters used in the wafer application to fabricate the structure.

System 700 also includes a metrology processor 716. In one exemplary embodiment, processor 710 can transmit the one or more values of the one or more profile parameters to metrology processor 716. Metrology processor 716 can then adjust one or more process parameters or equipment settings of the first fabrication cluster 702 based on the one or more values of the one or more profile parameters determined using optical metrology system 704. Metrology processor 716 can also adjust one or more process parameters or equipment settings of the second fabrication cluster 706 based on the one or more values of the one or more profile parameters determined using optical metrology system 704. As noted above, fabrication cluster 706 can process the wafer before or after fabrication cluster 702. In another exemplary embodiment, processor 710 is configured to train machine learning system 714 using the set of measured diffraction signals as inputs to machine learning system 714 and profile parameters as the expected outputs of machine learning system 714.

Although exemplary embodiments have been described, various modifications can be made without departing from the spirit and/or scope of the present invention. For example, although a focus detector array was primarily used to describe the embodiments of the invention; other position sensitive detectors may also be used. For automated process control, the fabrication clusters may be a track, etch, deposition, chemical-mechanical polishing, thermal, or cleaning fabrication cluster. Furthermore, the elements required for the auto focusing are substantially the same regardless of whether the optical metrology system is integrated in a fabrication cluster or used in a standalone metrology setup. Therefore, the present invention should not be construed as being limited to the specific forms shown in the drawings and described above.

What is claimed:

1. An apparatus for automatically focusing a workpiece in Z-axis, the workpiece being positioned for optical metrology of structures on the workpiece, the apparatus comprising:
    an auto focusing subsystem comprising:
        a light source generating a focus illumination beam directed to a workpiece, the focus illumination beam generating a focus detection beam;
        a focus detector having an array of sensors, the array of sensors having a pitch, each sensor of the array of sensors having a sensor identification (ID), the focus detector configured to measure the focus detection beam, generate a corresponding focus signal, and transmit both the focus signal and associated sensor ID for each sensor in the array of sensors;
    a processor generating a best focus instruction based on the transmitted focus signal and associated sensor ID for each sensor in the array of sensors; and
    a motion control subsystem configured to position the workpiece on a best focus location on the Z-axis using the best focus instruction from the processor.

2. The apparatus of claim 1, wherein the measurement of the focus detection beam, generation of the focus signal, transmission of the focus signal and associated ID of each sensor of the array of sensors, generation of best focus instruction, and positioning the workpiece to the best focus location are completed within a preset time duration.

3. The apparatus of claim 1, wherein the processor generating the focus signal into a best focus instruction uses an algorithm based on the pitch of the sensors, resolution of the Z-axis distance, and the sensor ID having the highest focus signal.

4. The apparatus of claim 1, wherein the light source includes an infrared light emitting diode or a laser device.

5. The apparatus of claim 1 wherein the auto focusing subsystem further comprises:
    optical components including reflective mirrors and/or lenses in the focus illumination beam path; and
    optical components including reflective mirrors and lenses in the focus detection beam path.

6. The apparatus of claim 1, wherein the workpiece is a wafer, a photomask, or a substrate.

7. The apparatus of claim 1, wherein the light source, the focus detector, the processor, and the motion control system are components of an optical metrology tool.

8. The apparatus of claim 7, wherein the optical metrology tool is part of an optical metrology system.

9. The apparatus of claim 7, wherein the optical metrology system is integrated with a semiconductor process tool.

10. The apparatus of claim 7, wherein the optical metrology system is part of a standalone metrology module.

11. The apparatus of claim 1, wherein the processor activates logic to derive a best focus position of the workpiece on the Z-axis based on sensor pitch, resolution of the Z-axis, focus signal, and sensor ID.

12. The apparatus of claim 2, wherein the preset time interval is 30 microseconds or less.

13. The apparatus of claim 1, wherein the array of sensors comprises 256 or more sensors, or wherein the pitch of the array of sensors is 12.5 nanometers or smaller.

14. The apparatus claim 1, wherein the focus detector performs the measurement at two megahertz or faster.

15. A method of auto focusing a workpiece in Z-axis for optical metrology tool in an integrated metrology fabrication cluster, the method comprising:

directing a focus illumination beam on a site on the workpiece, the focus illumination beam generating a focus detection beam;

measuring the focus detection beam using a focus detector, the focus detector having an array of sensors, each sensor of the array of sensors having a sensor identification (ID), the focus detector measuring the focus detection beam projected on a plurality of sensors in the array of sensors, generating a corresponding focus signal for each sensor in the array of sensors; and transmitting the plurality of focus signals and associated sensor IDs to a processor;

generating a best focus instruction based on the transmitted plurality of focus signals and associated sensor IDs using the processor; and moving the workpiece on the Z-axis based on the best focus instruction.

16. The method of claim 15, wherein measuring of the focus detection beam, generating the focus signal, transmitting the focus signal and associated ID of each sensor of the array of sensors, generating of best focus instruction, and positioning the workpiece to the best focus location are completed within a preset time duration.

17. The method of claim 15, wherein the array of sensors comprises 512 or more sensors, or wherein the pitch of the array of sensors is 12.5 nanometers or smaller.

18. The method claim 15, wherein the measurement of the focus detection beam for the array of sensors is performed at a speed of two megahertz or faster.

* * * * *